United States Patent
Kageyama (10) Patent No.: US 7,358,162 B2
(45) Date of Patent: Apr. 15, 2008

(54) METHOD OF MANUFACTURING SEMICONDUCTOR DEVICE

(75) Inventor: Makiko Kageyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 204 days.

(21) Appl. No.: 11/370,891

(22) Filed: Mar. 9, 2006

(65) Prior Publication Data

US 2006/0211225 A1    Sep. 21, 2006

(30) Foreign Application Priority Data

Mar. 15, 2005  (JP)  ............................. 2005-072755

(51) Int. Cl.
*H01L 21/36* (2006.01)
*H01L 21/20* (2006.01)
*H01L 33/00* (2006.01)
*H01L 21/322* (2006.01)

(52) U.S. Cl. ............... 438/479; 438/502; 438/509; 438/473; 438/765; 438/767; 257/103; 257/E21.112; 257/E21.121

(58) Field of Classification Search ............ 438/479, 438/502, 509, 473, 765, 767; 257/103, E21.112, 257/E21.121
See application file for complete search history.

(56) References Cited

U.S. PATENT DOCUMENTS 6,429,465 B1 *  8/2002  Yagi et al. ................ 257/103
6,861,335 B2 *  3/2005  Ueda ........................ 438/458
6,953,703 B2 * 10/2005  Moustakas ................ 438/46

FOREIGN PATENT DOCUMENTS

JP    10-070313    3/1998

* cited by examiner

*Primary Examiner*—Michael Lebentritt
*Assistant Examiner*—Mohsen Ahmadi
(74) *Attorney, Agent, or Firm*—Volentine & Whitt, P.L.L.C.

(57) ABSTRACT

A method of manufacturing a semiconductor device, includes the steps of: raising a temperature of a sapphire substrate which is included in the semiconductor device from a room temperature to a preheat temperature of 150° C. to 450° C. and keeping the preheat temperature for a first predetermined time, thereby preheating the semiconductor device; and subsequently raising a temperature of the sapphire substrate from the preheat temperature to a thermal reaction temperature of 500° C. or higher and keeping the thermal reaction temperature for a second predetermined time, thereby performing a thermal reaction treatment of the semiconductor device.

9 Claims, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device including a sapphire substrate (e.g., a sapphire wafer).

2. Description of the Related Art

The sapphire substrate is an insulating substrate. Unlike the silicon substrate (e.g., silicon wafer), in general, the sapphire substrate is not used alone in the semiconductor device fabrication. A semiconductor layer is provided on a surface of the sapphire substrate to form a composite semiconductor substrate (e.g., a composite semiconductor wafer), and the composite semiconductor substrate is used in the semiconductor device fabrication. For example, a silicon layer as a semiconductor layer is epitaxially grown on a surface of the sapphire substrate to form a silicon-on-sapphire (SOS) substrate (e.g., an SOS wafer), and then a semiconductor integrated circuit is fabricated in the silicon layer of the SOS substrate.

A lamp annealing technique is generally used in a rapid thermal annealing (RTA) process, in which short-time annealing is performed at 500° C. or higher, of the conventional method of manufacturing a semiconductor device using a silicon wafer. The lamp annealing technique uses a lamp annealing apparatus for heating an object by irradiating it with light emitted from the lamp. By directly irradiating the silicon wafer with light emitted form a tungsten halogen lamp, the silicon wafer absorbs the light, thereby being heated rapidly.

However, the SOS wafer is almost transparent to the wavelength of the light emitted from the tungsten halogen lamp and hardly absorbs the light. Therefore, the lamp annealing process by directly irradiating the wafer with light cannot increase the temperature of the SOS wafer and therefore cannot practically anneal the SOS wafer.

When annealing the SOS wafer, it is placed on a susceptor made of a carbon or ceramic material, and the susceptor carrying the SOS wafer is brought into a chamber of the lamp annealing apparatus. Heat is transferred from the susceptor heated by light emitted from the lamp to the SOS wafer. The indirect heating significantly reduces the temperature ramp rate, and therefore the gradual heating enables annealing of the SOS wafer.

The heat reaction treatment such as an activation process and a Salicide (Self-Aligned Silicide) process must be performed in a short period. In addition, the lamp annealing apparatus is an apparatus for a single-wafer and cannot put a long time into a temperature rise or temperature drop process. The temperature ramp rate should be at least about ½ to ⅕ of the temperature ramp rate of the RTA process for the silicon wafer without using the susceptor.

Figure 1:
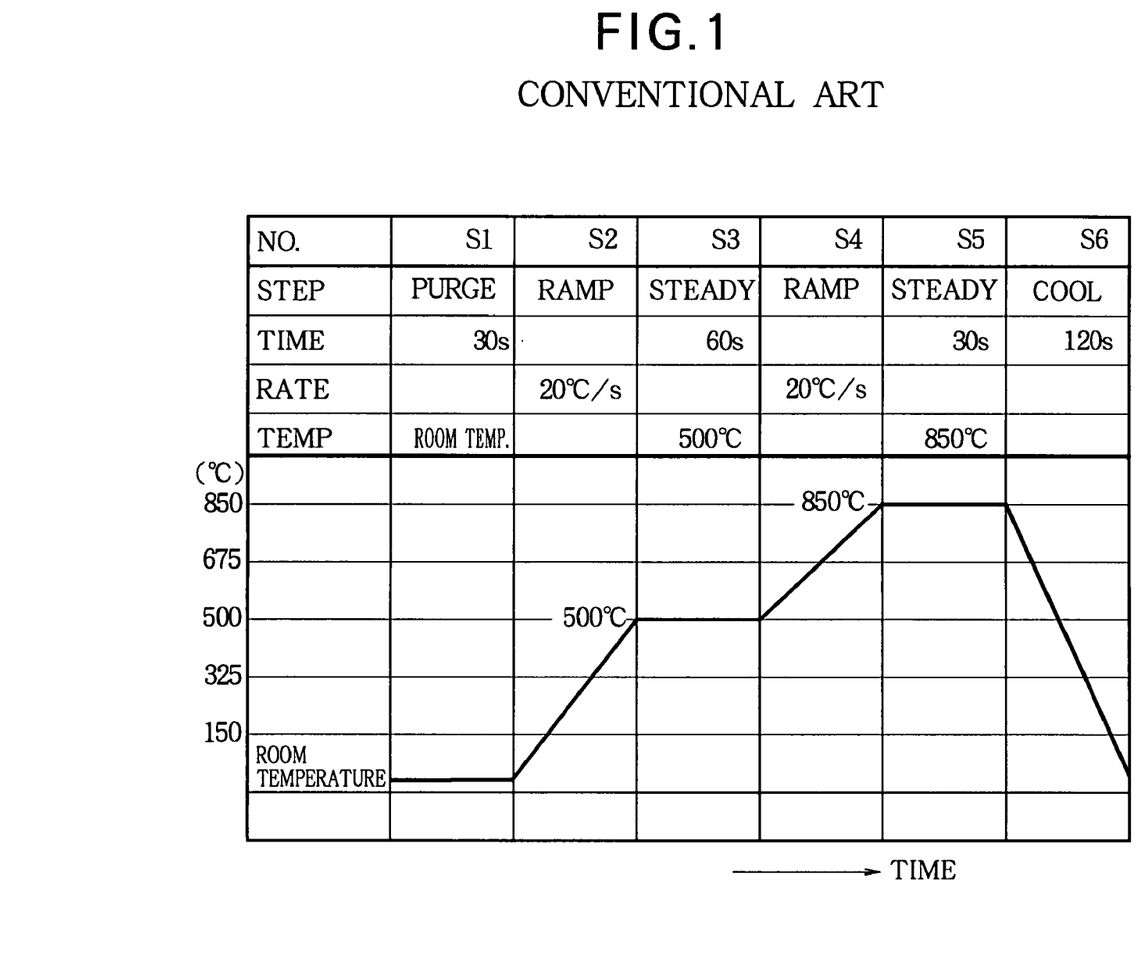
FIG. 1 is a diagram showing the process steps in the conventional method of manufacturing a semiconductor device.

FIG. 1 is a diagram showing the process steps in the conventional method of manufacturing a semiconductor device. In this case, the silicon wafer is heated for a thermal reaction treatment using the susceptor.

Referring to FIG. 1, in step S1 (PURGE), in order to purge a chamber of the lamp annealing apparatus, a nitrogen gas is introduced into the chamber for 30 seconds. In step S2 (RAMP), the temperature is raised from a room temperature to 500° C. at a temperature ramp rate of 20 degrees centigrade per second (° C./s). In step S3 (STEADY), the temperature of 500° C. is kept for 60 seconds to pre-anneal the semiconductor device. In step S4 (RAMP), the temperature is further raised to 850° C. at a temperature ramp rate of 20° C./s. In step S7 (STEADY), the temperature of 850° C. is kept for 30 seconds to perform the thermal reaction treatment of the semiconductor device. In step S6 (COOL), the temperature is lowered from 850° C. to the room temperature over 120 seconds.

In the conventional method using the susceptor as shown in FIG. 1, in consideration of the thermal capacity of the susceptor, the pre-anneal step S3 (STEADY) of keeping the temperature of 500° C. for 60 seconds is provided for the purposes of stabilizing the temperature of the susceptor and leveling out the temperature distribution of the susceptor, and the temperature ramp rate is lowered to 20° C./s, which is a low level for the lamp annealing apparatus and is lower than the temperature ramp rate in the conventional method using no susceptor.

There is another method of manufacturing a semiconductor device using a sapphire wafer forms a thin film having a high thermal conductivity or a high light absorption on the back side of the sapphire wafer, so that heat is transferred to the sapphire wafer efficiently. Refer to the Japanese Patent Application Kokai (Laid-Open) Publication No. 10-70313, for example.

However, in the conventional lamp annealing of the silicon wafer using the susceptor as shown in FIG. 1, the actual time-varying temperature profile of the silicon wafer around 850° C. is sharp and has a quick follow-up capability to the specified temperature. In contrast to this, in the conventional lamp annealing of the SOS wafer, the actual time-varying temperature profile of the SOS wafer around 850° C. lags behind (i.e., causes an undershoot of) the temperature rise of the susceptor, thereby lowering the follow-up capability.

Figure 2:
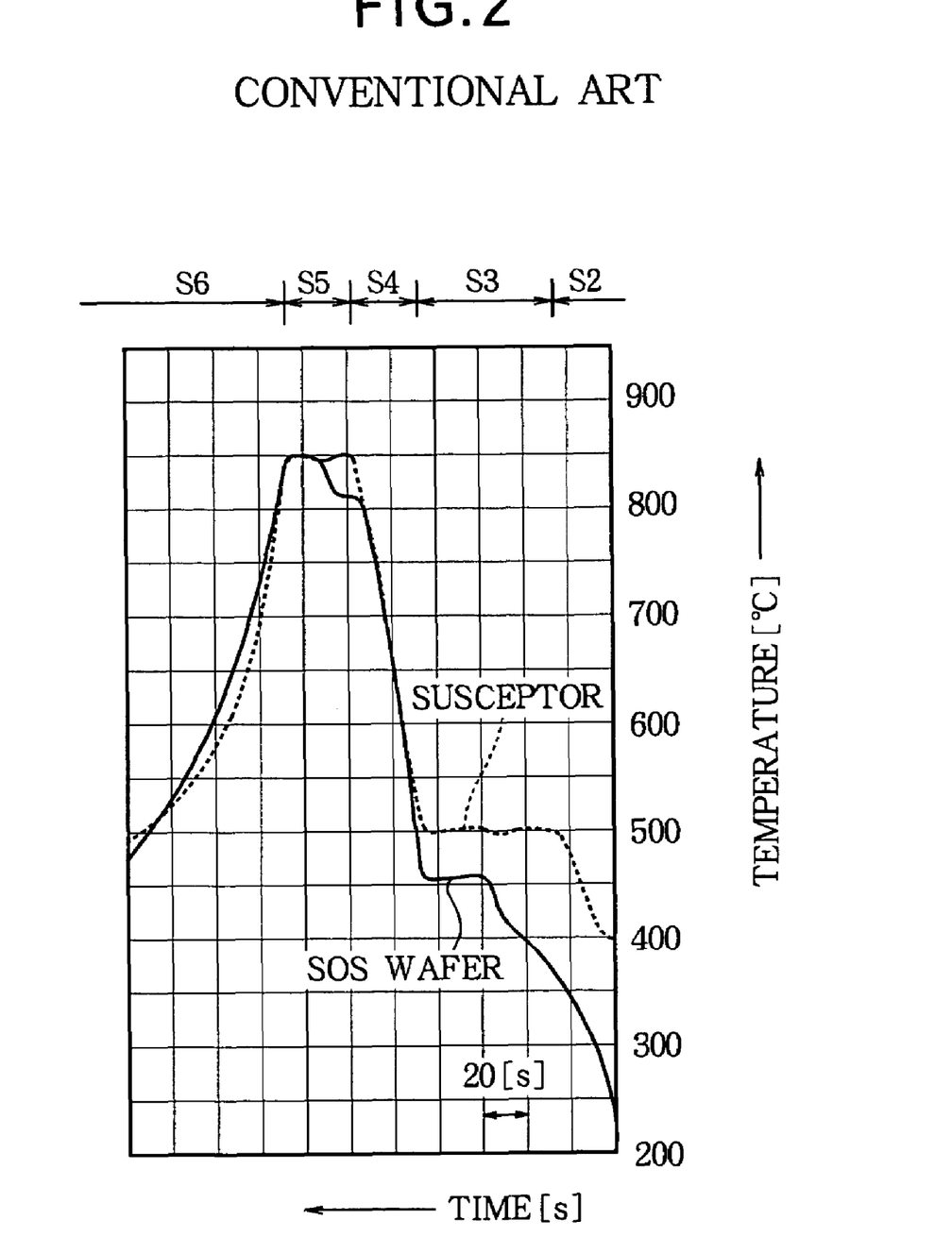
FIG. 2 is a diagram showing the time-varying temperature profiles of the SOS wafer and the susceptor in the conventional method shown in FIG. 1.

FIG. 2 is a diagram showing the time-varying temperature profiles of the center of the SOS wafer and of the susceptor in the conventional lamp annealing using the susceptor shown in FIG. 1. The temperature of the SOS wafer is detected by a special thermocouple provided on the SOS wafer. The temperature of the susceptor is detected by a pyrometer equipped in the lamp annealing apparatus.

In the lamp annealing apparatus, the pyrometer detects the temperature of the susceptor, the intensity of lamp output is controlled in accordance with the detected temperature, and the temperature is controlled accordingly. As shown in FIG. 2, the temperature of the susceptor can be controlled accurately, but the temperature of the SOS wafer reaches a specified temperature of 850° C. after a lag. The temperature of the SOS wafer continues to be about 40° C. lower than the temperature of the susceptor (specified temperature) for about 15 seconds. In the annealing step at the specified temperature of 850° C. for 30 seconds, the temperature of the SOS wafer is kept at the specified temperature for about 15 seconds actually.

Therefore, the shorter-period annealing cannot bring the SOS wafer to the specified temperature and cannot provide a desired effect of annealing even if the SOS wafer reaches the specified temperature after the lag in the temperature rise.

In this case, since the temperature of the susceptor is controlled as specified, it is difficult to improve the follow-up capability of the time-varying temperature profile during the temperature rise of the SOS wafer by changing the specified output intensity and/or illumination time of the lamp.

The definite causes of the lag in the temperature rise of the SOS wafer have not yet been found. However, it seems that the lag is ascribable to the sapphire wafer, and it seems that the causes of the lag are that the thermal conductivity of sapphire (42 W/m·K) is lower than ⅓ of the thermal conductivity of silicon (130 W/m·K), the thermal expansion coefficient of sapphire depends on the orientation of the crystal axis, the sapphire wafer has an internal stress.

It is also known that the sapphire wafer becomes warped when heated. The definite cause of the warp has not been found either. Possible causes include the following: Since the thermal conductivity of sapphire is up to ⅓ of that of silicon, there occurs a temperature difference between the front side and the back side of the sapphire wafer; the difference in the thermal expansion coefficient causes a local variation of the expansion coefficient when the temperature rises; and the internal stress cannot be suppressed because of the temperature rise. The warped sapphire wafer decreases the area contacting with the susceptor which is a heat source. The uneven contact between the susceptor and the sapphire wafer would interfere with heat transfer further and would further delay the temperature rise.

Further, when the sapphire wafer is placed on a hot plate heated in advance to heat the sapphire wafer at a high temperature ramp rate, the same phenomenon as described above would occur, thereby producing the same problems as described above.

SUMMARY OF THE INVENTION

An object of the present invention is to provide a method of manufacturing a semiconductor device which can reduce the lag in the temperature rise of the sapphire substrate, thereby providing a time-varying temperature profile with a high follow-up capability.

According to the present invention, a method of manufacturing a semiconductor device, includes the steps of: raising a temperature of a sapphire substrate which is included in the semiconductor device from a room temperature to a preheat temperature of 150° C. to 450° C. and keeping the preheat temperature for a first predetermined time, thereby preheating the semiconductor device; and subsequently raising a temperature of the sapphire substrate from the preheat temperature to a thermal reaction temperature of 500° C. or higher and keeping the thermal reaction temperature for a second predetermined time, thereby performing a thermal reaction treatment of the semiconductor device.

According to the present invention, since the sapphire substrate is preheated at a preheat temperature within the range of 150° C. to 450° C. and is further heated to a thermal reaction temperature of 500° C. or higher, a lag in the temperature rise of the sapphire substrate up to the thermal reaction temperature can be reduced. Therefore, a time-varying temperature profile can be obtained with a high follow-up capability.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 3:
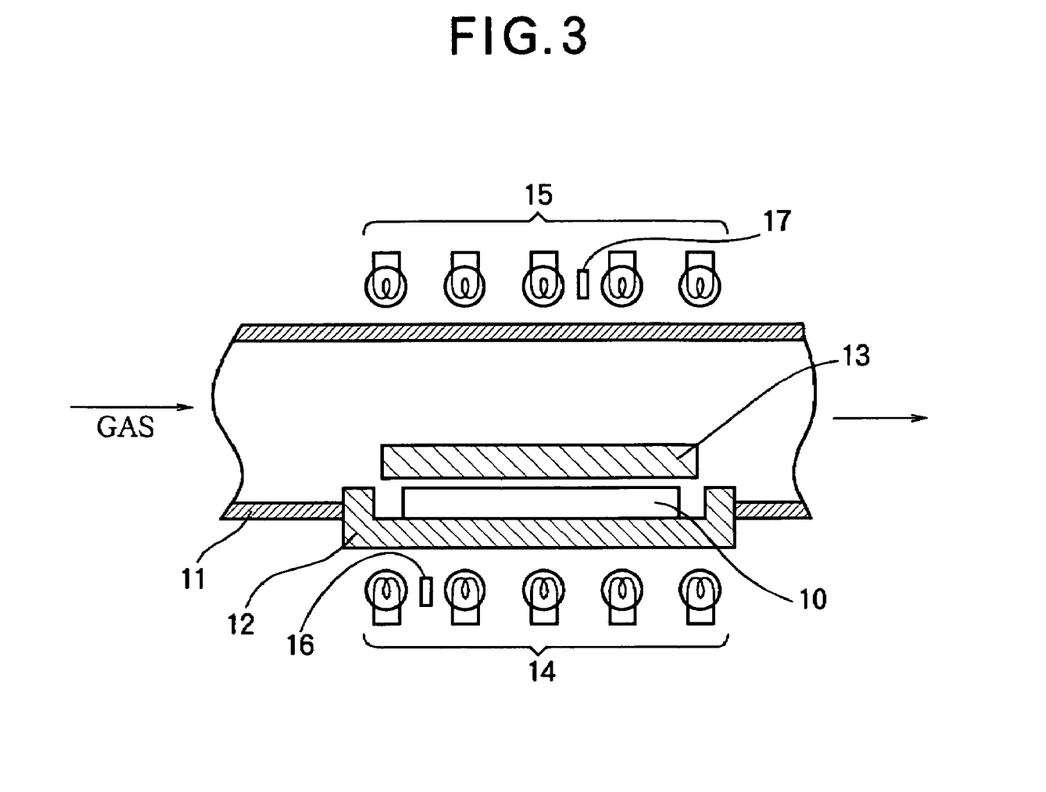
FIG. 3 is a diagram schematically showing a sectional view of a lamp annealing apparatus for performing a method of manufacturing a semiconductor device according to the first to third embodiments of the present invention.

FIG. 3 is a diagram schematically showing a sectional view of a lamp annealing apparatus for performing a method of manufacturing a semiconductor device according to the first to third embodiments of the present invention. Referring to FIG. 3, the lamp annealing apparatus includes a chamber 11 such as a transparent container with an inlet and an outlet. An SOS wafer 10 is brought into the chamber 11 and a gas is introduced into chamber 11. The lamp annealing apparatus further includes a susceptor 12 facing a lower surface of the SOS wafer 10 and supporting the SOS wafer 10, a susceptor 13 facing an upper surface (i.e., a semiconductor layer side) of the SOS wafer 10 and disposed at a location a little distance from the upper surface of the SOS wafer 10, lamps 14 and 15 for irradiating the susceptors 12 and 13, and pyrometers 16 and 17 for measuring a temperature of the susceptors 12 and 13. Further, the structure of the lamp annealing apparatus is not limited to the illustrated one.

Figure 4:
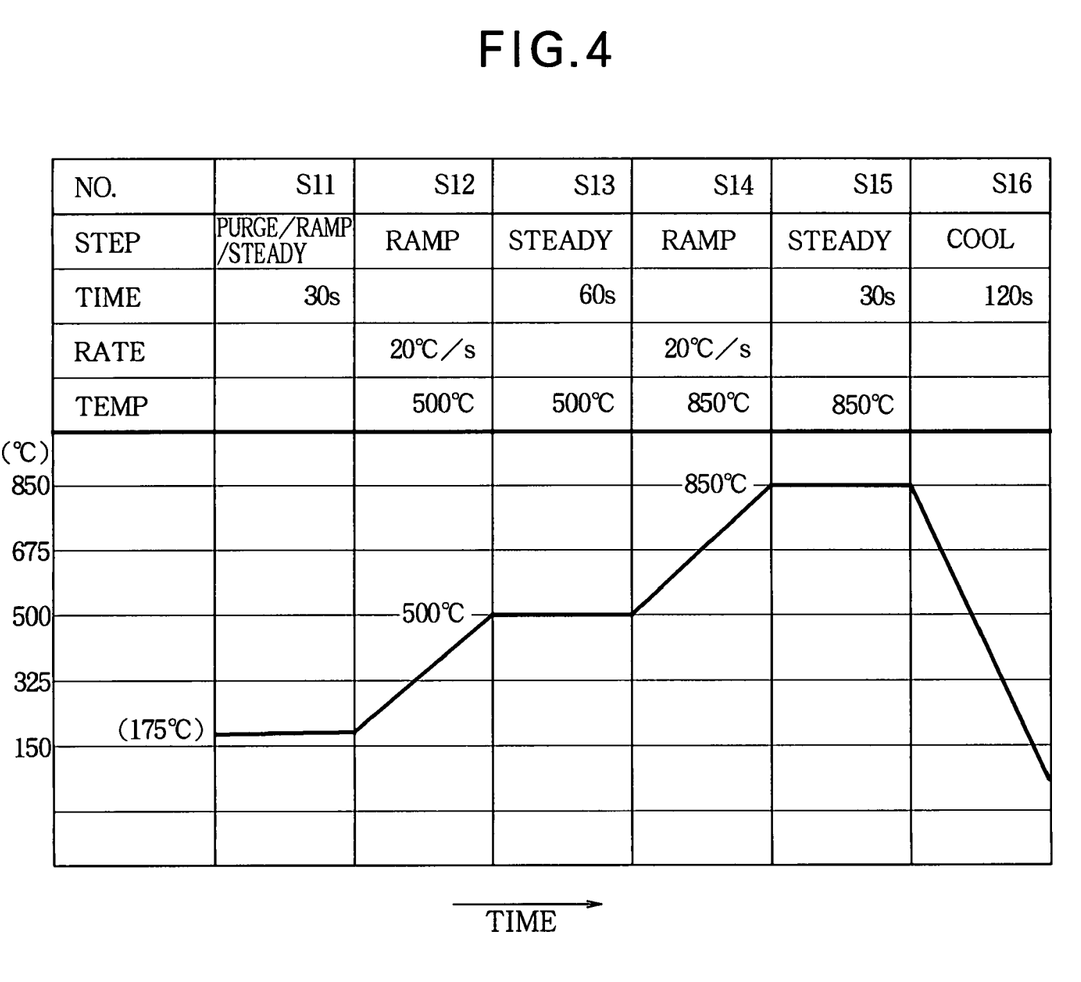
FIG. 4 is a diagram showing the process steps in a method of manufacturing a semiconductor device according to the first embodiment of the present invention.

FIG. 4 is a diagram showing the process steps in a method of manufacturing a semiconductor device according to the first embodiment of the present invention. In the first embodiment, the process steps are specified to cause a thermal reaction treatment of the SOS wafer at 850° C. by using the susceptor.

The process steps of the first embodiment shown in FIG. 4 differ from the conventional process steps shown in FIG. 1, in that the SOS wafer is preheated to about 175° C. (175° C.±50° C., for example) in step S11 (PURGE/RAMP/STEADY), and in step S12 (RAMP), the SOS wafer is further heated from the temperature of about 175° C.

Figure 5:
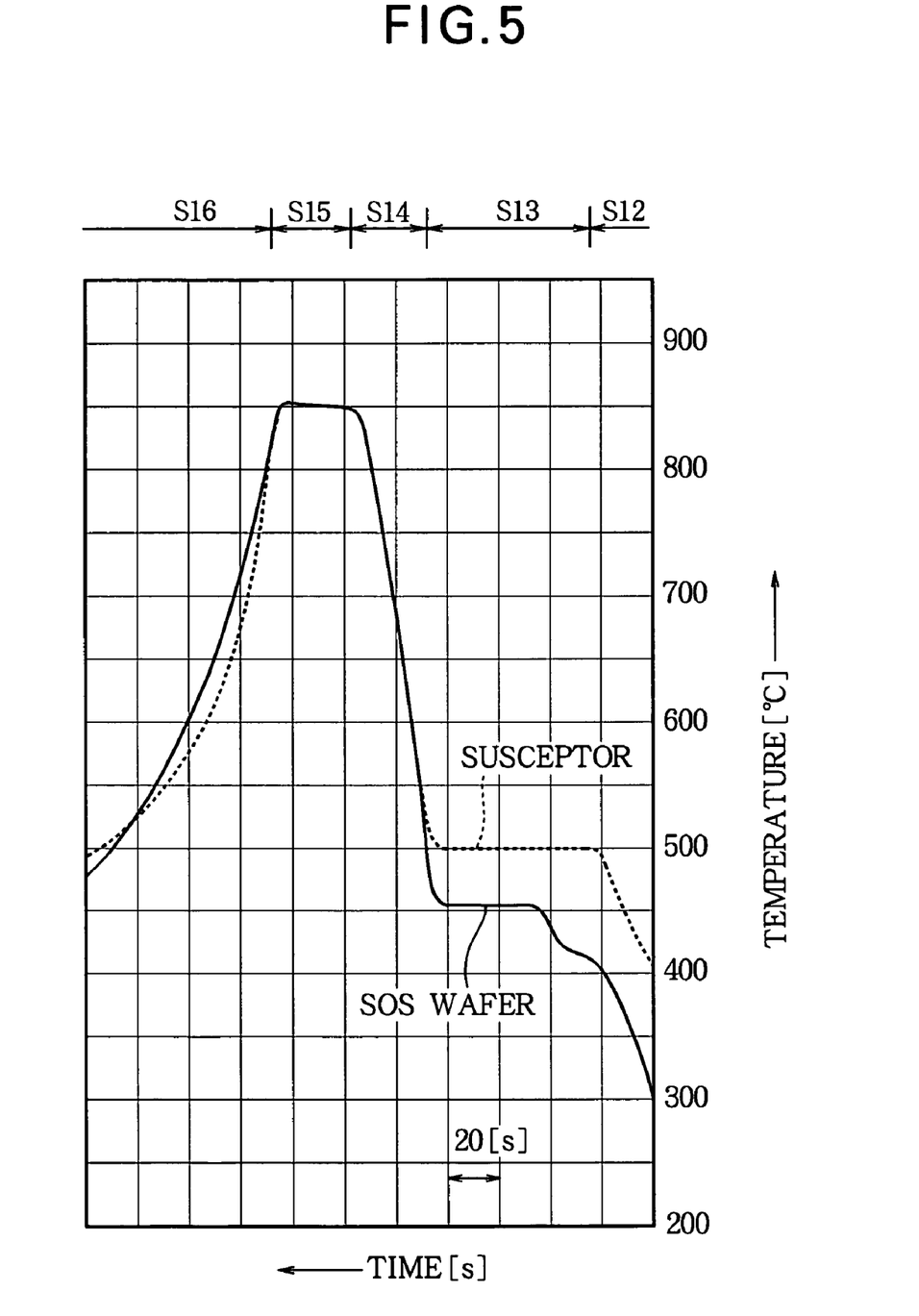
FIG. 5 is a diagram showing the time-varying temperature profiles of the SOS wafer and the susceptor in the process steps shown in FIG. 4.

FIG. 5 is a diagram showing the time-varying temperature profiles in the center of the SOS wafer and the susceptor in the process steps of the first embodiment. The temperature of the SOS wafer is detected by a special thermocouple provided on the SOS wafer, and the temperature of the susceptor is detected by a pyrometer equipped in the lamp annealing apparatus.

In step S11 (PURGE/RAMP/STEADY) shown in FIG. 4, the SOS wafer is placed on a susceptor made of a carbon or ceramic material, the susceptor carrying the SOS wafer is brought into a chamber of the lamp annealing apparatus, a nitrogen gas is introduced into the chamber for 30 seconds to purge the atmosphere in the chamber with a nitrogen gas, and the SOS wafer is preheated within the range of 150° C. to 450° C., preferably at about 175° C.

In the low-temperature range such as the preheat temperature of the first embodiment, the pyrometer for detecting the temperature of the susceptor, cannot detect the temperature of the susceptor accurately because of its structure. The temperature detected by the pyrometer has an offset from the actual temperature of the susceptor and the actual temperature of the SOS wafer. Controlling the lamp output to bring the temperature detected by the pyrometer to the specified temperature cannot heat the susceptor and the SOS wafer to the specified temperature.

Accordingly, preheating in the first embodiment is performed in this way, for example: The intensity of lamp output to heat the susceptor is fixed to 10% in the first 10 to 15 seconds; after the SOS wafer is heated to the preheat temperature mainly by the heat transferred from the susceptor, the lamp is turned off (i.e., the intensity of lamp output is set to 0%), and the SOS wafer is kept at the preheat temperature for the remaining 15 to 20 seconds. After the lamp is turned off, the temperature of the SOS wafer gradually lowers in the remaining 15 to 20 seconds. For example, when the target preheat temperature is 175° C., an error of ±50° C. occurs. Therefore, the SOS wafer is preheated in the actual preheat temperature range of 175° C.±50° C., i.e., an actual preheat temperature range of 125° C. to 225° C.

An offset amount between the temperature detected by the pyrometer and the actual temperature of the SOS wafer can be known in advance. Therefore, if the actual temperature of the SOS wafer becomes close to the target preheat temperature of 175° C. when the temperature detected by the pyrometer is 300° C., for example, the SOS wafer can be preheated by keeping the preheat temperature for 15 to 20 seconds through maintaining the specified temperature of 300° C. for 15 to 20 seconds in the preheating step S11. In this case, there occurs a difference of ±50° C. from the target preheat temperature of 175° C., and the SOS wafer is preheated at the actual preheat temperature of 175° C.±50° C., i.e., an actual preheat temperature range of 125° C. to 225° C.

If the structure of the susceptor allows annealing by a heater, the SOS wafer can be preheated by keeping the preheat temperature through heating by the heater in the preheating step S11.

The preheating step S11 of the first embodiment is intended to preheat the SOS wafer by keeping the preheat temperature within the range of 150° C. to 200° C. (for example, about 175° C.) for 10 seconds or longer. Preheating the SOS wafer at about 175° C. before the temperature rise for the pre-annealing and the thermal reaction treatment eliminates the warp of the SOS wafer or prevents the wafer from warping, maintains contact between the entire surface of the SOS wafer and the susceptor, and levels out the temperature distribution of the SOS wafer.

In the pre-anneal-temperature raising step S12 (RAMP), the intensity of lamp output is controlled to bring the temperature ramp rate to 20° C./s. The susceptor and the SOS wafer are heated until the detected temperature of the susceptor becomes 500° C.

In the pre-anneal treatment step S13 (STEADY), the intensity of lamp output is controlled in accordance with the detected temperature of the susceptor, so that the temperature of 500° C. is maintained for 60 seconds.

The pre-anneal treatment step S13 is performed to stabilize the temperature of the susceptor in consideration of the thermal capacity of the susceptor and to level out the temperature distribution of the susceptor. When the temperature detected by the pyrometer reaches the pre-anneal temperature of 500° C. specified for the first embodiment, the actual temperature of the SOS wafer ranges from 450° C. to 470° C. as shown in step S13 of FIG. 5, and the actual temperature of the susceptor would also range from 450° C. to 470° C.

In the thermal-reaction-temperature raising step S14 (RAMP), the intensity of lamp output is controlled to bring the temperature ramp rate to 20° C./s, and the susceptor is further heated until a temperature of 850° C. is detected, thereby heating the SOS wafer further.

In the thermal reaction treatment step S15 (STEADY), the intensity of lamp output is controlled in accordance with the detected temperature of the susceptor, and a temperature of 850° C. is kept for 30 seconds.

The specified temperature of 850° C. in the thermal reaction treatment step S15 is the highest temperature in a series of steps of the first embodiment, and is a thermal reaction temperature for causing the thermal reaction treatment such as silicidation and activation of the SOS wafer.

In a temperature falling step S16 (COOL), the lamp is turned off (i.e., the intensity of lamp output is set to 0%), the temperature of the SOS wafer is lowered from 850° C. to a room temperature over 120 seconds, and the susceptor carrying the SOS wafer is driven out of the chamber of the lamp annealing apparatus.

In the first embodiment, heat treatment is carried out in three steps: the SOS wafer is preheated at 175° C. in the preheating step S11 in FIG. 4; after the preheating step S11, the temperature rise for the pre-annealing and the thermal reaction treatment starts, and a specified temperature of 500° C. is maintained for 60 seconds in the pre-anneal treatment step S13 in FIG. 4; and a specified temperature of 850° C. is maintained for 30 seconds in the thermal reaction treatment step S15 in FIG. 4.

The preheating step S11 raises the temperature at which heating of the SOS wafer for pre-annealing and thermal reaction treatment starts from a room temperature to about 175° C., providing a time-varying temperature profile of the SOS wafer without a lag (i.e., without an undershoot) and with a good follow-up capability when the temperature rises to 850° C. specified for the thermal reaction treatment, as shown in steps S14 and S15 of FIG. 5.

One cause of the lag in the temperature rise of the SOS wafer is a warp in a heated wafer, which is unique to the SOS wafer and the sapphire wafer. The SOS wafer is warped by 1 to 2 mm when it is placed on a heated stage of around 200° C., and after the wafer is left on the stage for 1 or 2 minutes, the warp is eliminated. In a process such as lamp annealing, in which a rapid temperature rise occurs on the susceptor, a warped wafer has a reduced area of contact with the susceptor, greatly reducing the temperature ramp rate, making the internal temperature distribution of the wafer uneven, and making the temperature profile of the wafer unsteady.

In the first embodiment, with preheating at about 175° C. in the preheating step S11 before the temperature rise starts for the pre-anneal treatment step and the thermal reaction step, the temperature and the thermal expansion coefficient are leveled out on the front side and back side of the SOS wafer; a warp is eliminated or prevented from occurring; and even contact can be maintained between the entire back side of the SOS wafer and the entire front side of the susceptor. The temperature rise under these circumstances can provide an even temperature distribution in the entire wafer side and a good, stable time-varying temperature profile without a lag in the temperature rise.

The preheat temperature of 175° C. in the preheating step S11 of the first embodiment is far lower than the thermal reaction temperature of 850° C. specified for the thermal reaction treatment. The low temperature can eliminate a lag in the temperature rise in the conventional process steps as shown in FIG. 1 and would not excessively promote the thermal reaction treatment such as activation and silicidation, which properly occurs in the thermal reaction treatment step S15. The preheating step S11 would not cause the thermal reaction treatment occurring in the thermal reaction treatment step S15 to go ahead of the reaction planned in the original step, eliminating the need for changing the settings of the pre-annealing process, which includes the pre-anneal-temperature raising step S12 and the pre-anneal treatment step S13, and the thermal reaction process, which includes the thermal-reaction-temperature raising step S14 and the thermal reaction treatment step S15. With the preheat temperature step, the same effect as the thermal reaction treatment obtained by the conventional process steps as shown in FIG. 1 (the same effect as the thermal reaction treatment expected when the original steps are specified) can be obtained if there is no lag in the temperature rise of the SOS wafer.

According to the first embodiment, since the SOS wafer is preheated at 175° C. in the preheating step S11 before the temperature rises for the thermal reaction treatment, the SOS wafer can be heated smoothly. Therefore, a good time-varying temperature profile can be obtained without a lag in the temperature rise.

Second Embodiment

Figure 6:
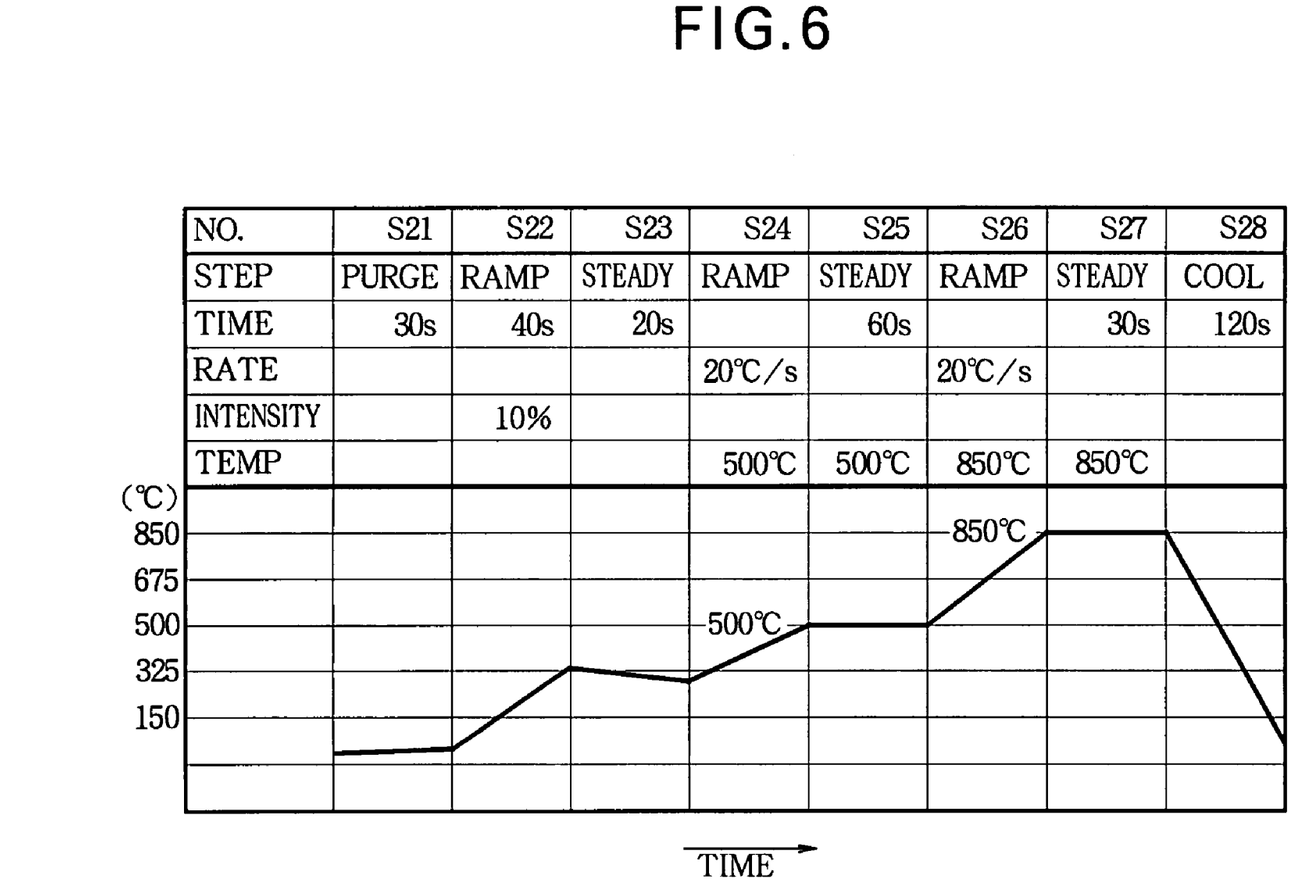
FIG. 6 is a diagram showing the process steps in a method of manufacturing a semiconductor device according to the second embodiment of the present invention.

FIG. 6 is a diagram showing the process steps in a method of manufacturing a semiconductor device according to the second embodiment of the present invention. In the second embodiment, the process steps are specified to cause a thermal reaction treatment of the SOS wafer at 850° C. by using the susceptor.

The process steps of the second embodiment shown in FIG. 6 differ from the conventional process steps shown in FIG. 1, in that a preheating step is provided to preheat the SOS wafer to about 300° C. (300° C.±50° C., for example) and the SOS wafer is heated further from about 300° C. for the pre-annealing and the thermal reaction treatment.

Figure 7:
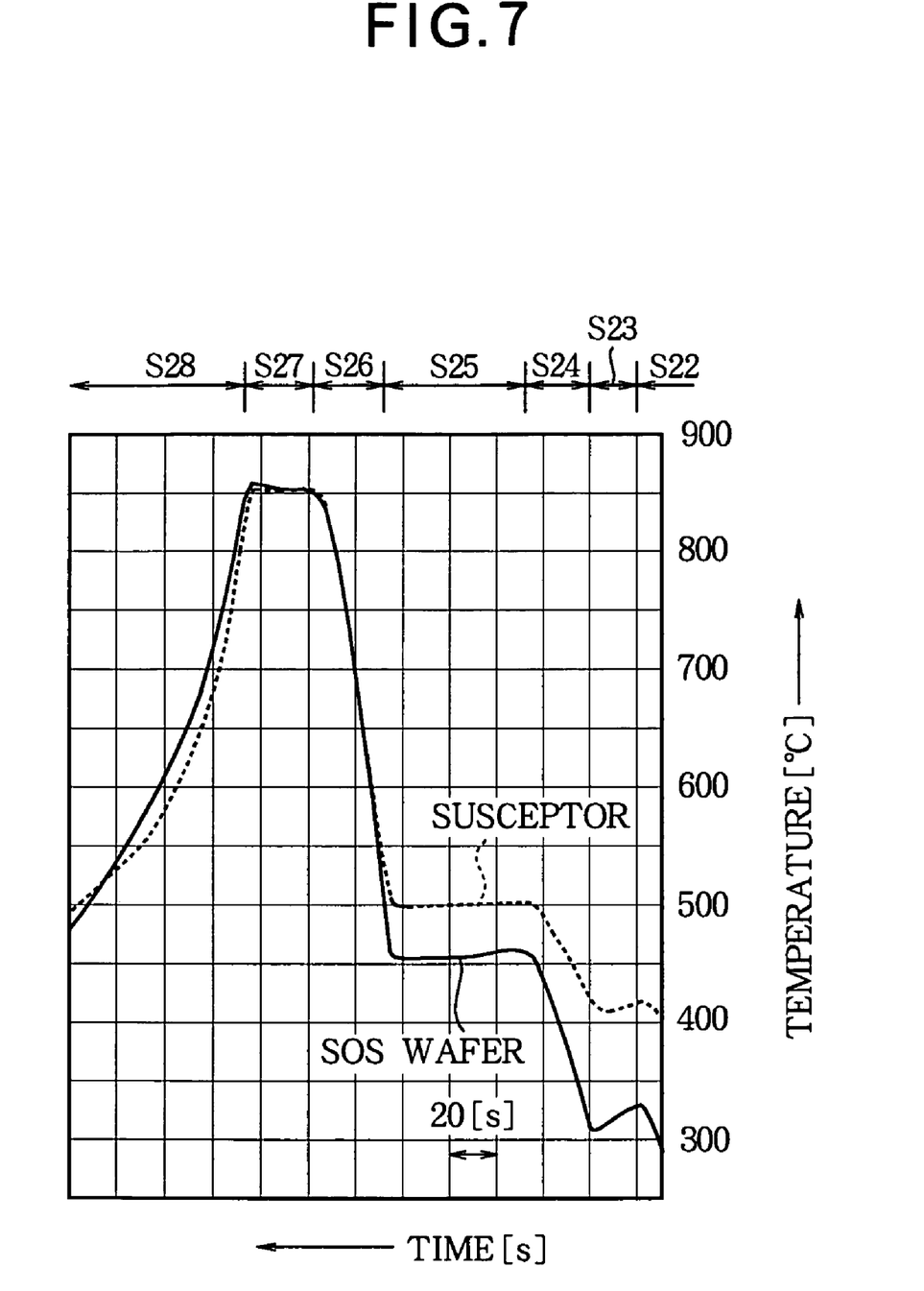
FIG. 7 is a diagram showing the time-varying temperature profiles of the SOS wafer and the susceptor in the process steps shown in FIG. 6.

FIG. 7 is a diagram showing the time-varying temperature profiles in the center of the SOS wafer and the susceptor in the process steps of the second embodiment of the present invention. The temperature of the SOS wafer is detected by a special thermocouple provided on the SOS wafer, and the temperature of the susceptor is detected by a pyrometer equipped in a lamp annealing apparatus.

In step S21 (PURGE) shown in FIG. 6, the SOS wafer is placed on a susceptor made of a carbon or ceramic material; the susceptor carrying the SOS wafer is brought into a chamber of the lamp annealing apparatus; and a nitrogen gas is introduced into the chamber for 30 seconds and the atmosphere in the chamber is purged with the nitrogen gas. In the meantime, the lamp is turned off (i.e., the output intensity is 0%), or the lamp is idle (i.e., the output intensity is 1% to 2%). At this time, the SOS wafer and the susceptor are at a room temperature.

In the preheat-temperature raising step S22 (RAMP), the intensity of lamp output is set to 10%, and the SOS wafer and the susceptor are exposed to the light emitted form the lamp for 40 seconds to be heated.

In the preheat treatment step S23 (STEADY), the lamp is turned off (i.e., the intensity of lamp output is set to 0%) for 20 seconds to allow the SOS wafer to be preheated.

As shown in FIG. 7, the temperature of the SOS wafer is raised to a range of 320° C. to 330° C. at the end of the preheat-temperature raising step S22. In the preheat treatment step S23, the lamp is turned off, and therefore the temperature gradually decreases to a range of 300° C. to 310° C. at the end of the preheat treatment step S23.

In the low-temperature range such as the preheat temperature of the second embodiment, the pyrometer for detecting the temperature of the susceptor cannot detect the temperature of the susceptor accurately because of its structure. The temperature detected by the pyrometer has an offset from the actual temperature of the susceptor and the actual temperature of the SOS wafer. Controlling the lamp output to bring the temperature detected by the pyrometer to the specified temperature cannot heat the susceptor and the SOS wafer to the specified temperature.

Accordingly, in the preheating process, which includes the preheat-temperature raising step S22 and the preheat treatment step S23, of the second embodiment, the intensity of lamp output is tied to a certain level and the SOS wafer is heated to a preheat temperature, then the lamp is turned off to keep the SOS wafer at the preheat temperature. When the target preheat temperature is 300° C., for example, the temperature is not measured by a thermocouple in volume production and is controlled by the lamp, so that an error of ±50° C. occurs. Therefore, the SOS wafer is preheated at an actual preheat temperature of 300° C.±50° C. in consideration of the error, i.e., an actual preheat temperature of 250° C. to 350° C.

An offset amount between the temperature detected by the pyrometer and the actual temperature of the SOS wafer can be known in advance. Therefore, if the actual temperature of the SOS wafer approaches a target preheat temperature of 300° C. when the temperature detected by the pyrometer is 400° C., for example, the SOS wafer can be preheated by keeping a preheat temperature for 20 seconds through raising the temperature to a specified temperature of 400° C. in the preheat-temperature raising step S22, and keeping the specified temperature of 400° C. for 20 seconds in the preheat treatment step S23. In this case, an error of ±50° C. also occurs with respect to the target preheat temperature of 350° C. The SOS wafer is preheated at an actual preheat temperature of 300° C.±50° C. in consideration of the error, i.e., at an actual preheat temperature of 250° C. to 350° C.

The preheating process of the second embodiment is intended to preheat the SOS wafer by keeping the preheat temperature of about 300° C. for 20 seconds. Preheating the SOS wafer at about 300° C. before the temperature rise for the pre-annealing and the thermal reaction treatment eliminates a warp of the SOS wafer or prevents the wafer from warping, maintains contact between the whole surface of the SOS wafer and the susceptor, and levels out the temperature distribution of the SOS wafer.

The preheating process to keep the SOS wafer at a preheat temperature according to the present invention includes an action accompanying a degree of temperature drop by turning off the lamp (i.e., by stopping heating), as in the second embodiment, and an action to control the preheat temperature in accordance with the detected temperature. The step does not include an action to raise the temperature of the susceptor and SOS wafer gradually at a low rate.

In the pre-anneal-temperature raising step S24 (RAMP), the intensity of lamp output is controlled to bring the temperature ramp rate to 20° C./s, as in the pre-anneal-temperature raising step S22 (RAMP) of the first embodiment shown in FIG. 4, and the susceptor and SOS wafer are heated until the detected temperature of the susceptor reaches 500° C.

The pre-anneal treatment step S25 (STEADY), the thermal-reaction-temperature raising step S26 (RAMP), the thermal reaction treatment step S27 (STEADY), and the temperature falling step (COOL) S28 of the second embodiment shown in FIG. 6 are the same as the pre-anneal treatment step S13 (STEADY), the thermal-reaction-temperature raising step S14 (RAMP), the thermal reaction treatment step S15 (STEADY), and the temperature falling step S16 (COOL) of the first embodiment shown in FIG. 4 respectively.

Referring to FIG. 6, the method of the second embodiment includes the preheating process S22-S23 of preheating by keeping the intensity of lamp output at 10% for 40 seconds and turning the lamp off for 20 seconds. After the preheating process S22-S23, the heat treatment of three steps is performed: The temperature rise for the pre-annealing and the thermal reaction treatment starts; the specified temperature of 500° C. is kept for 60 seconds in the pre-anneal treatment step S25 (STEADY) shown in FIG. 6, and the specified temperature of 850° C. is kept for 30 seconds in the thermal reaction treatment step S27 shown in FIG. 6. As shown in FIG. 7, the preheating process brings the SOS wafer to the preheat temperature of about 300° C.

The preheating process raises the temperature, at which the temperature rise of the SOS wafer for the pre-annealing and the thermal reaction treatment starts from a room temperature to about 300° C., providing a time-varying temperature profile without a lag (i.e., without an undershoot) and with a good follow-up capability when the temperature rises to 850° C. specified for the thermal reaction treatment, as shown in steps S26 and S27 of FIG. 7.

One cause of the lag in the temperature rise of the SOS wafer is a warp in a wafer, which occurs when the SOS wafer or the sapphire wafer is heated. In the SOS wafer, the characteristics of the warp may change in the heat history. The possible cause is that a difference in the thermal expansion coefficient between the silicon layer and the sapphire layer of the substrate creates distortion on the interface of the SOS substrate (i.e., the interface between the silicon layer and the sapphire layer), in single-wafer heat treatment including rapid heating and rapid cooling. If the distortion is created through many steps of the heat treatment, the warp of the wafer may not be sufficiently eliminated according to the first embodiment.

According to the second embodiment, with preheating at about 300° C., which is higher than in the first embodiment, before the temperature rise starts for the pre-annealing and the thermal reaction treatment, a warp can be eliminated from an SOS wafer subjected to several times of heat treatment. Since the temperature rises while even contact is maintained between the entire back side of the SOS wafer and the entire front side of the susceptor, an even temperature distribution can be provided across the wafer side, and a good, stable temperature profile can be obtained without a lag in the temperature rise.

The preheating process of the second embodiment performs preheating at 300° C., which is higher than the preheat temperature of about 175° C. in the first embodiment and lower than the thermal reaction temperature of 850° C. specified for the thermal reaction treatment. The temperature is low enough to correct the lag in the temperature rise in the conventional steps shown in FIG. 1, as in the first embodiment, but the low preheat temperature would not excessively promote the thermal reaction treatment such as activation and silicidation, which properly occurs in the thermal reaction treatment step S27. The preheating process would not cause the thermal reaction treatment occurring in the thermal reaction treatment step S27 to go ahead of the reaction planned in the original step, eliminating the need for changing the settings of the pre-annealing process, which includes the pre-anneal-temperature raising step S24 and the pre-anneal treatment step S25, and the thermal reaction process, which includes the thermal-reaction-temperature raising step S26 and the thermal reaction treatment step S27. With the preheating process, the same effect as the thermal reaction treatment obtained by the conventional steps as shown in FIG. 1 (i.e., the effect of the thermal reaction treatment expected when the original steps are specified) can be obtained if there is no lag in the temperature rise of the SOS wafer.

According to the second embodiment, since the preheating process of preheating the SOS wafer at about 300° C. before the temperature rise for the pre-annealing, the thermal reaction treatment makes it possible to heat the SOS wafer smoothly. Therefore, a time-varying temperature profile without a lag in the temperature rise and with a good follow-up capability can be obtained.

Third Embodiment

Figure 8:
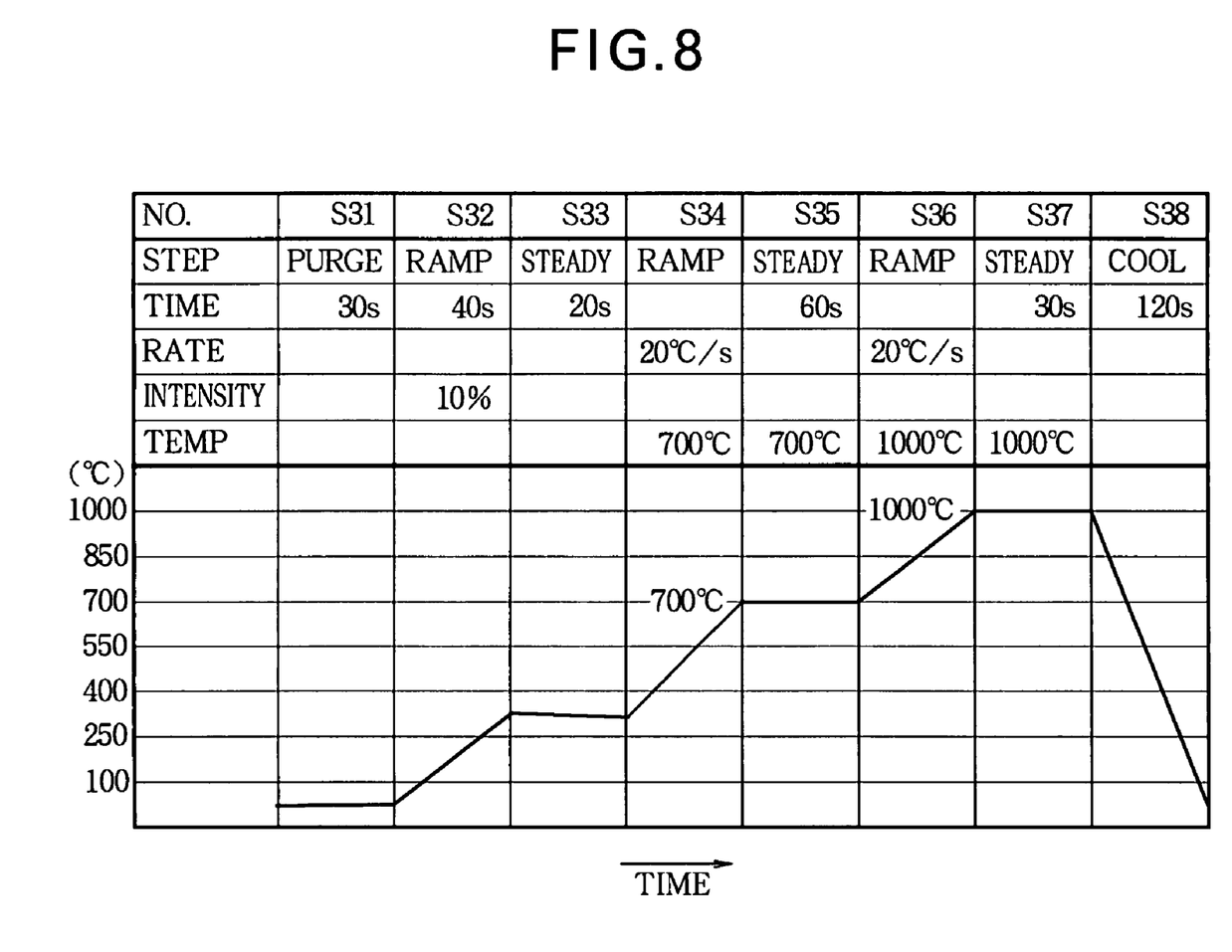
FIG. 8 is a diagram showing the process steps in a method of manufacturing a semiconductor device according to the third embodiment of the present invention.

FIG. 8 is a diagram showing the process steps of a method of manufacturing a semiconductor device according to the third embodiment of the present invention. In the third embodiment, a thermal reaction treatment of the SOS wafer is performed at 1000° C. using a susceptor by the lamp annealing.

The third embodiment differs from as the second embodiment in the following points. In the third embodiment, the pre-anneal temperature in the pre-annealing process S34-S35 after the preheating process S31-S33 is 700° C., and the temperature specified for the thermal reaction treatment is 1000° C. The third embodiment is the same as the second embodiment except for the above points.

The purge step S31 (PURGE), the preheat-temperature raising step S32 (RAMP), and the preheat treatment step S33 (STEADY) of the third embodiment shown in FIG. 8 are the same as the purge step S21 (PURGE), the preheat-temperature raising step S22 (RAMP), and the preheat treatment step S23 (STEADY) of the second embodiment shown in FIG. 6, respectively.

At the end of the preheat treatment step S33 (STEADY), the temperature of the SOS wafer reaches about 300° C. In the pre-anneal-temperature raising step S34 (RAMP), the intensity of lamp output is controlled to bring the temperature ramp rate to 20° C./s, and the susceptor and the SOS wafer are heated until the detected temperature of the susceptor reaches 700° C.

In the pre-anneal treatment step S35 (STEADY), the intensity of lamp output is controlled in accordance with the detected temperature of the susceptor, and the temperature of 700° C. is kept for 60 seconds for allowing the pre-annealing.

A pre-annealing process, which includes the pre-anneal-temperature raising step S34 (RAMP) and the pre-anneal treatment step S35 (STEADY), is provided for the purpose of stabilizing the temperature of the susceptor in consideration of the thermal capacity of the susceptor and to level out the temperature distribution of the susceptor. The temperature of 700° C. specified for the pre-annealing is determined because the pyrometer can detect the accurate temperature of the susceptor in the temperature range. In the pre-annealing process, the actual temperature of the SOS wafer, and the susceptor reaches the same level as the temperature of 700° C. detected by the pyrometer.

In the thermal-reaction-temperature raising step S36 (RAMP), the intensity of lamp output is controlled to bring the temperature ramp rate to 20° C./s, and the susceptor is heated until the detected temperature of the susceptor reaches 1000° C., thereby heating the SOS wafer.

In the thermal reaction treatment step S37 (STEADY), the intensity of lamp output is controlled in accordance with the detected temperature of the susceptor, and the temperature of 1000° C. is kept for 30 seconds.

The temperature of 1000° C. specified in the thermal reaction treatment step S37 (STEADY) is the highest temperature in a series of steps S31-S38 of the third embodiment and is a thermal reaction temperature for causing a thermal reaction treatment such as silicidation and activation of the SOS wafer.

In the third embodiment, the temperature specified for the thermal reaction treatment is 1000° C., which is higher than 850° C. specified in the second embodiment. Accordingly, the pre-anneal temperature in the third embodiment is set to 700° C., which is different from the pre-anneal temperature of 500° C. in the second embodiment.

In the temperature falling step S38 (COOL), the lamp is turned off (i.e., intensity of lamp output is set to 0%) to decrease the temperature of the SOS wafer from 1000° C. to a room temperature over 120 seconds, and the susceptor carrying the SOS wafer is brought out of the chamber of the lamp annealing apparatus.

According to the third embodiment, since the preheating process S31-S33 is provided to preheat the SOS wafer at about 300° C. before the pre-annealing process S34-S25 and the thermal reaction process S36-S37 in the same manner as the second embodiment, the SOS wafer can be smoothly heated. Therefore, a time-varying temperature profile can be obtained without a lag in the temperature rise and with a good follow-up capability.

Although the preheat temperature in the first embodiment ranges from 125° C. to 225° C., determined from the target temperature of 175° C. and an error of ±50° C., if the preheat temperature is too low, the advantage that a lag in the temperature rise of the wafer is eliminated cannot be obtained. Since this advantage should be obtained within the range of 125° C. to 225° C. and a visible warp occurring when the wafer is placed on the heat stage of 200° C. should be eliminated within 1 to 2 minutes, it is desirable that the preheat temperature be an actual wafer temperature of 150° C. or higher.

In the second and third embodiments, the preheat temperature ranges from 250° C. to 350° C., which is determined by the target temperature of 300° C. and an error of ±50° C. If the preheat temperature is too high, the thermal reaction treatment that should occur in the thermal reaction treatment step S37 would be promoted, and the thermal reaction process, which includes the thermal-reaction-temperature raising step S36 and the thermal reaction treatment step S37, should be modified because of the preheating process. For example, cobalt utilized in the salicide process is a metal that forms a silicide layer at a low temperature. A silicide layer predominantly composed of cobalt monosilicide is formed by heat treatment at 510° C., for example. Therefore, the preheat temperature should be an actual wafer temperature of 450° C. or lower, so that the thermal reaction treatment occurring at 500° C. or higher is not promoted excessively.

In addition, the preheat temperature of 150° C. to 450° C. should be kept 10 seconds or longer, in order to obtain a time-varying temperature profile having a good follow-up capability in the temperature range of the thermal reaction treatment after preheating to 150° C. to 450° C.

In the above described embodiments, the pre-annealing process, which includes the pre-anneal-temperature raising step S36 and the pre-anneal treatment step S37, is provided to level out the temperature distribution of the susceptor. If the temperature specified for the thermal reaction treatment ranges from 600° C. to 900° C., the pre-annealing process is performed at a specified temperature within the range of 450° C. to 550° C. for 30 seconds. If the temperature specified for the thermal reaction treatment is 900° C. or higher, the pre-anneal treatment step S35 is performed at a specified temperature 200° C. to 550° C. lower than the specified temperature for 30 seconds. The pre-annealing process S34-S35 is not an absolute necessity for obtaining the effect of the preheating process of the method of manufacturing a semiconductor device of the present invention, and therefore the present invention can be applied to thermal process without the pre-annealing process.

Figure 9A:
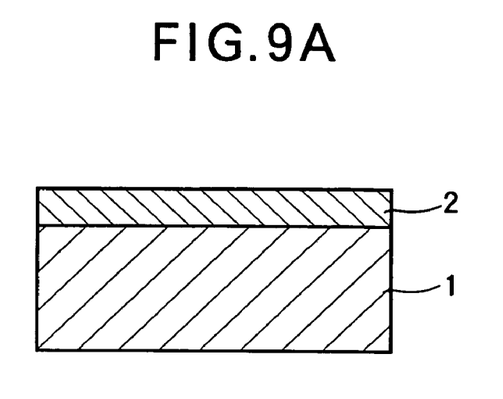
FIGS. 9A to 9C are diagrams each showing the structure of a semiconductor substrates, to which the present invention is applied.

The embodiments indicate examples of the method of manufacturing a semiconductor device of the present invention applied to the SOS wafer. The present invention can be applied also to a composite semiconductor substrate (e.g., a composite semiconductor wafer) having a semiconductor layer 2 on the surface of a sapphire substrate (e.g., a sapphire wafer) 1, as shown in FIG. 9A. The semiconductor layer 2 may be a gallium nitride layer or another layer, besides the silicon layer in the embodiments described above. The semiconductor layer 2 is epitaxially grown on the sapphire substrate (e.g., a sapphire wafer) 1 by a CVD method, a metal organic CVD method, or another method.

Figure 9B:
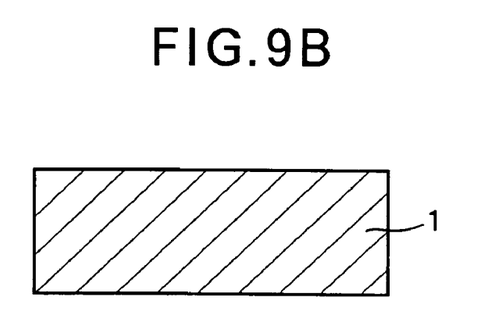

Since the main cause of a lag in the temperature rise of the SOS wafer results from the sapphire wafer, the present invention can be applied to a single sapphire substrate 1, as shown in FIG. 9B. A step of heating the sapphire substrate 1 alone can be a step of epitaxially growing a semiconductor layer on the surface of the substrate. When a silicon layer is epitaxially grown by a CVD method, the sapphire substrate 1 is kept at a temperature of 750° C. to 950° C. When a gallium nitride layer is epitaxially grown, the sapphire substrate 1 is kept at a temperature of 1000° C. to 1100° C. When the present invention is applied, the temperature during these layers are epitaxially grown in the present invention is specified as a thermal reaction temperature.

Figure 9C:
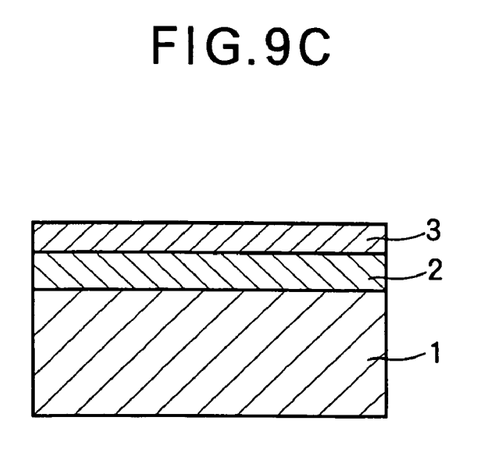

In addition, the present invention can be applied to a composite semiconductor substrate (e.g., a composite semiconductor wafer) as shown in FIG. 9C, which has a conductive thin or insulating film 3 provided on the semiconductor layer 2 of the composite semiconductor substrate shown in FIG. 9A. The thin film 3 can be a gate oxide film or a layer-to-layer insulating film, such as a polysilicon film, a silicon oxide film, and a silicon nitride film; a thin metal film for forming a salicide structure or a silicide film, such as a cobalt film and a nickel film; or a barrier metal formed in a contact hole for a tungsten plug, such as a titanium film and a titanium nitride film.

The actual steps of the semiconductor fabrication process, to which the present invention is applied, include a step of epitaxially growing the silicon layer, the gallium nitride layer, or another semiconductor layer; a step of silicidating the cobalt film, the nickel film, or another thin metal film; a step of activating an ion implanted in a semiconductor layer by ion implantation; and a step of annealing the titanium film, the titanium nitride film, or another barrier metal, besides the RTA process.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of manufacturing a semiconductor device, comprising the steps of:
    raising a temperature of a sapphire substrate which is included in the semiconductor device from a room temperature to a preheat temperature of 150 degree C. to 450 degree C. and keeping the preheat temperature for a first predetermined time, thereby preheating the semiconductor device; and
    subsequently raising a temperature of the sapphire substrate from the preheat temperature to a thermal reaction temperature of 500 degree C. or higher and keeping the thermal reaction temperature for a second predetermined time, thereby performing a thermal reaction treatment of the semiconductor device;
    wherein the step for the preheating is performed by irradiating a susceptor facing the semiconductor device with light emitted from a lamp and subsequently turning off the lamp.

2. The method according to claim 1, wherein the first predetermined time is 10 seconds or longer.

3. The method according to claim 1, wherein the preheat temperature ranges from 250° C. to 350° C.

4. The method according to claim 3, wherein the first predetermined time is 20 seconds or longer.

5. The method according to claim 1, wherein the step for the thermal reaction treatment includes the steps of:
    raising the temperature of the sapphire substrate from the preheat temperature to a pre-anneal temperature of 450° C. to 550° C. and keeping the pre-anneal temperature for a third predetermined time; and
    raising the temperature of the sapphire substrate from the pre-anneal temperature to the thermal reaction temperature of 600° C. to 900° C. and keeping the thermal reaction temperature for a fourth predetermined time.

6. The method according to claim 1, wherein the step for the thermal reaction treatment includes the steps of:
    raising the temperature of the sapphire substrate from the preheat temperature to a pre-anneal temperature 200° C. to 550° C. lower than the thermal reaction temperature and keeping the pre-anneal temperature for a third predetermined time; and
    raising the temperature of the sapphire substrate from the pre-anneal temperature to the thermal reaction temperature of 900° C. or higher and keeping the thermal reaction temperature for a fourth predetermined time.

7. The method according to claim 1, wherein the semiconductor device includes:
    the sapphire substrate; and
    a semiconductor layer disposed on a surface of the sapphire substrate.

8. The method according to claim 7, wherein the semiconductor layer is a silicon layer.

9. The method according to claim 7, wherein the semiconductor device further includes at least one of a conductive thin film and an insulating thin film disposed on the semiconductor layer.

* * * * *